United States Patent
Kamp-Froese et al.

(10) Patent No.: US 11,188,000 B2
(45) Date of Patent: Nov. 30, 2021

(54) METHOD AND DEVICE FOR CHARACTERIZING A MASK FOR MICROLITHOGRAPHY

(71) Applicant: Carl Zeiss SMT GmbH, Oberkochen (DE)

(72) Inventors: Michael Kamp-Froese, Aalen (DE); Markus Koch, Neu-Ulm (DE); Tobias Mueller, Langenau (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 15/931,790

(22) Filed: May 14, 2020

(65) Prior Publication Data

US 2020/0363737 A1 Nov. 19, 2020

(30) Foreign Application Priority Data

May 15, 2019 (DE) .......................... 102019112675.4

(51) Int. Cl.
*G03F 7/20* (2006.01)
*G03F 1/84* (2012.01)

(52) U.S. Cl.
CPC ............ *G03F 7/70891* (2013.01); *G03F 1/84* (2013.01); *G03F 7/70258* (2013.01); *G03F 7/70308* (2013.01); *G03F 7/70516* (2013.01); *G03F 7/70558* (2013.01)

(58) Field of Classification Search
CPC ..... G03F 1/84; G03F 1/24; G03F 1/38; G03F 7/70033; G03F 7/70283; G03F 7/705; G03F 7/70783; G03F 7/70341; G03F 7/70891
USPC ..................................................... 355/30, 77
See application file for complete search history.

(56) References Cited

U.S. PATENT DOCUMENTS

| 9,354,048 B2* | 5/2016 | Blaesing-Bangert ....................... G03F 9/7011 |
| 2005/0167514 A1* | 8/2005 | Kaushal .................... G03F 1/68 236/1 C |
| 2008/0246933 A1* | 10/2008 | Uchikawa ........... G03F 7/70883 355/52 |

FOREIGN PATENT DOCUMENTS

| DE | 102007051390 | 5/2009 | ............. G01B 11/14 |
| DE | 102011113940 | 3/2013 | ............... G03F 7/20 |
| DE | 102012213794 | 2/2014 | ........... G01N 21/956 |
| DE | 102014209455 | 11/2015 | ............... G03F 9/00 |

(Continued)

OTHER PUBLICATIONS

German Office Action for German Application No. DE 10 2019 112 675.4, dated Jan. 17, 2020 (with English Translation).

(Continued)

*Primary Examiner* — Hung Nguyen
(74) *Attorney, Agent, or Firm* — Fish & Richardson P.C.

(57) ABSTRACT

A method and a device for characterizing a mask for microlithography in a characterization process carried out using an optical system, wherein the optical system includes an illumination optical unit and an imaging optical unit and wherein in the characterization process structures of the mask are illuminated by the illumination optical unit, the mask is imaged onto a detector unit by the imaging optical unit and image data recorded by the detector unit are evaluated in an evaluation unit. A method includes the following steps: determining a temporal variation of at least one variable that is characteristic of the thermal state of the optical system, and modifying the characterization process depending on the temporal variation determined.

26 Claims, 4 Drawing Sheets

(56) References Cited

FOREIGN PATENT DOCUMENTS

| DE | 102017115240 | 8/2018 | ............. | G01B 11/24 |
| WO | WO 2014/019870 | 2/2014 | ............... | G03F 7/20 |

OTHER PUBLICATIONS

Office Action issued by the German Patent Office for Application No. DE 10 2019 112 675.4, dated Aug. 17, 2021 (with English Translation).

* cited by examiner

METHOD AND DEVICE FOR CHARACTERIZING A MASK FOR MICROLITHOGRAPHY

CROSS REFERENCE TO RELATED APPLICATIONS

This application claims priority of German Patent Application DE 10 2019 112 675.4, filed on May 15, 2019. The content of the above application is hereby incorporated by reference.

TECHNICAL FIELD

The invention relates to a method and a device for characterizing a mask for microlithography. The invention is applicable both to finding defects and in further applications for characterizing the structures on a mask, for instance position determination or determining the line width of the structures (CD="critical dimension").

BACKGROUND

Microlithography is used for production of microstructured components, for example integrated circuits or LCDs. The microlithography process is conducted in what is called a projection exposure apparatus, which comprises an illumination device and a projection lens. The image of a mask (=reticle) illuminated by use of the illumination device is in this case projected by use of the projection lens onto a substrate (e.g., a silicon wafer) coated with a light-sensitive layer (photoresist) and arranged in the image plane of the projection lens, in order to transfer the mask structure to the light-sensitive coating of the substrate.

In the lithography process, undesired defects on the mask have a particularly disadvantageous effect since they can be reproduced with every exposure step. A direct analysis of the imaging effect of possible defect positions is thus desirable in order to minimize the mask defects and in order to realize a successful mask repair. Therefore, there is a need to measure or to qualify the mask rapidly and simply, to be precise as far as possible under the same conditions such as are really present in the projection exposure apparatus.

For this purpose, it is known, inter alia, in a mask inspection apparatus, to record and evaluate an aerial image of a segment of the mask. For recording the aerial image, in this case the structures to be measured on the mask are illuminated by an illumination optical unit, wherein the light coming from the mask is projected via an imaging optical unit onto a detector unit and detected. In order to carry out the measurement of the mask if possible under conditions analogous to those in the projection exposure apparatus, in the mask inspection apparatus the mask is typically illuminated in a manner identical to that in the projection exposure apparatus, wherein in particular the same wavelength, the same numerical aperture and also the identical (if appropriate polarized) illumination setting are set in the mask inspection apparatus.

One problem that occurs in practice during the characterization of a mask is that, e.g., after a change in the illumination setting or else after the mask to be examined has been loaded into the optical system used for the characterization, initially there is no thermal equilibrium in the relevant optical system. Corresponding temperature differences, which can also be caused, e.g., owing to the fact that, directly before being loaded into the relevant optical system, the mask was subjected to further process steps proceeding at a different temperature in each case or which may also have been brought about by other (prior) measurements carried out beforehand in the specific optical system itself, in turn result in thermal relaxation processes, which can lead to an erroneous characterization (e.g., an erroneous determination of specific mask parameters) as a result.

One possible approach for overcoming the problem described above involves firstly waiting for a certain (run-in) phase to elapse, e.g., after a change in the illumination setting or after the mask has been loaded into the optical system used for the characterization, although this—particularly in the case where the optical system approaches thermal equilibrium comparatively slowly—is accompanied by an undesired decrease in the throughput ultimately achieved with the optical system, or a reduction of the measurement time available overall (on account of the idle times necessitated by the waiting phases).

Further possible approaches include measures for temperature stabilization in the relevant optical system, e.g., by using cooling devices or optimizing the design of the thermal linking of the individual optical components, although this in turn is accompanied by an increase in the complexity of the construction and the equipment outlay for mask characterization.

Regarding the prior art, reference is made merely by way of example to DE 10 2007 051 390 A1.

SUMMARY

In a general aspect, the present invention provides a method and a device for characterizing a mask for microlithography which enable a reliable mask characterization while at least partly avoiding the problems described above.

A method according to the invention for characterizing a mask for microlithography in a characterization process carried out using an optical system, wherein the optical system comprises an illumination optical unit and an imaging optical unit and wherein in the characterization process structures of the mask are illuminated by the illumination optical unit, the mask is imaged onto a detector unit by the imaging optical unit and image data recorded by the detector unit are evaluated in an evaluation unit, comprises the following steps:

determining a temporal variation of at least one variable that is characteristic of the thermal state of the optical system; and modifying the characterization process depending on the temporal variation determined.

The invention is based on the concept, in particular, of not avoiding disturbances of thermal equilibrium that occur during the characterization of a mask for microlithography (and are caused, e.g., by a change in the illumination setting or by a new mask being loaded into the respective optical system) for instance by introducing waiting times and/or measures of thermal stabilization, but rather indeed deliberately accepting such disturbances of thermal equilibrium, but quantitatively ascertaining the disturbances and/or the relevant temperature effects and taking them into account, if appropriate, by way of a modification of the characterization process (e.g., carrying out a corresponding correction).

In particular, according to the invention, the temporal variation of at least one variable that is characteristic of the thermal state of the optical system used for characterizing the mask is determined, the characterization process then being modified depending on this temporal variation determined.

In exemplary embodiments of the invention (but without the invention being restricted thereto), determining the temporal variation includes the use of one or more temperature sensors present in the optical system. By use of such temperature sensors, the temperature at at least one position in the optical system, in particular the temperature of one or more optical components situated in the optical system, and thus the current thermal drift of the optical system in each case can be ascertained repeatedly.

The modification according to the invention of the characterization process itself, said modification being carried out depending on the temporal variation determined, can comprise, as described below, manipulating the position or moving one or more optical components in the optical system, actively changing measurement sequences carried out for characterizing the mask, changing the evaluation of the recorded image data or changing the calculation of specific mask parameters or else a combination of the measures mentioned.

What is advantageously achieved as a result in the method according to the invention is a reduction of the equipment outlay during mask characterization (owing to possibly dispensing with measures for thermal stabilization) while at the same time increasing the measurement time or the throughput achieved with the optical system used for the characterization (owing to undesired waiting times being avoided).

In accordance with one embodiment, the step of modifying the characterization process comprises a temporary interruption of the characterization process. Said temporary interruption of the characterization process can be effected, in particular, as soon as the determined temporal variation of the variable that is characteristic of the thermal state of the optical system exceeds a predefined threshold value.

In accordance with one embodiment, the step of determining a temporal variation comprises imaging a structureless region of the mask.

In accordance with one embodiment, the step of determining a temporal variation comprises ascertaining a lateral displacement of the position of a stop in the image data recorded by the detector unit.

In accordance with one embodiment, the step of modifying the characterization process comprises carrying out at least one additional calibration step.

In accordance with one embodiment, the step of modifying the characterization process comprises modifying the evaluation of the image data recorded by the detector unit.

In accordance with one embodiment, the characterization process is begun without waiting for a relaxation time duration to elapse after a change in the illumination setting set in the illumination optical unit or after the mask has been loaded into the optical system.

The invention furthermore relates to a device for characterizing a mask for microlithography, comprising an illumination optical unit for illuminating structures on the mask, a detector unit, an imaging optical unit for imaging the mask onto the detector unit, and an evaluation unit for evaluating the image data recorded by the detector unit, wherein the device is configured to carry out a method having the features described above. With regard to advantages and preferred configurations of the device, reference is made to the above explanations in association with the method according to the invention.

Further configurations of the invention can be gathered from the description and the dependent claims.

The invention is explained in greater detail below on the basis of exemplary embodiments illustrated in the accompanying figures.

DETAILED DESCRIPTION

Figure 1:
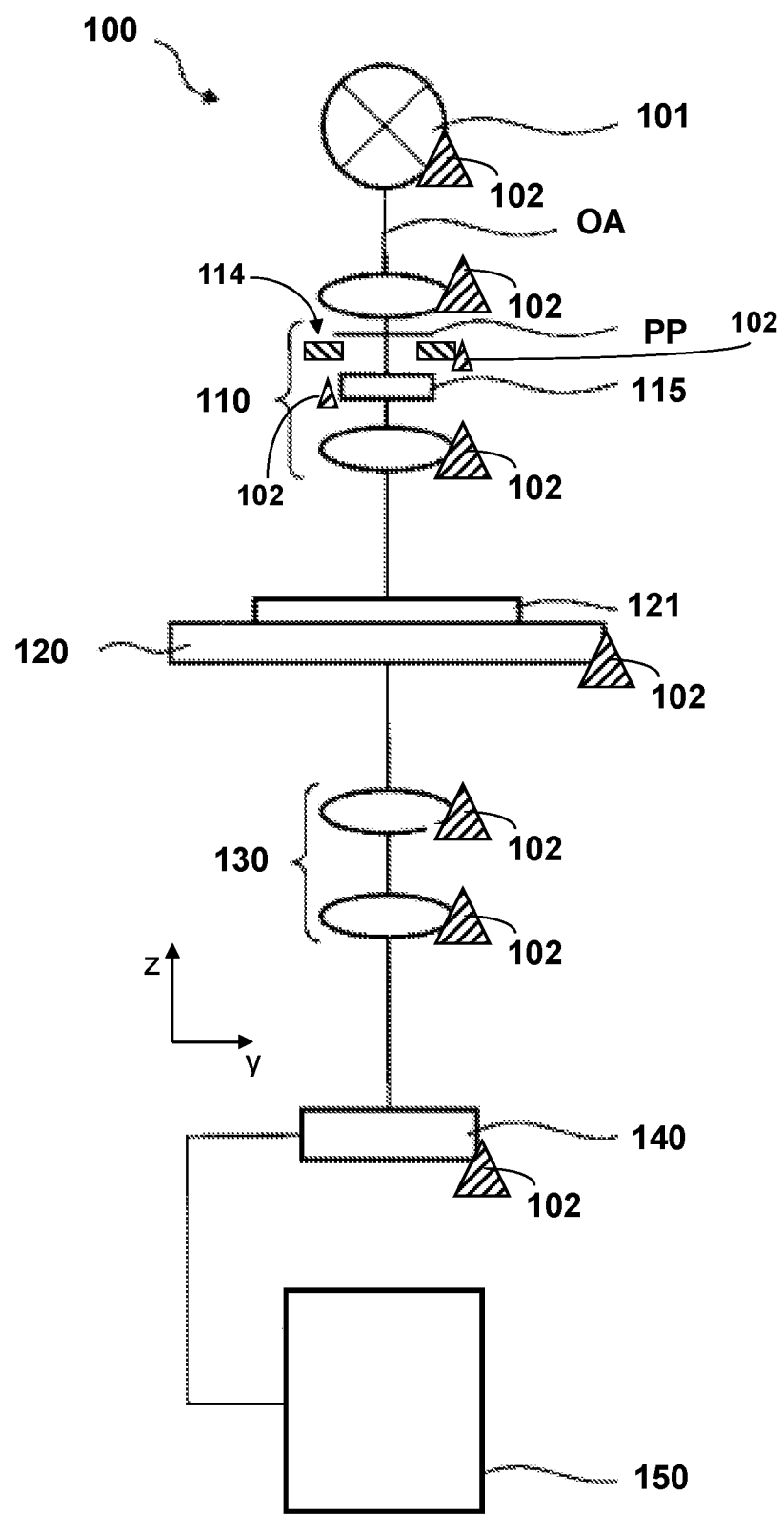
FIG. 1 shows a schematic illustration for elucidating one exemplary construction of an optical system for characterizing a mask for microlithography.

FIG. 1 shows, as an example of an optical system for characterizing a mask for microlithography, the possible construction of a mask inspection apparatus 100 in which the present invention can be realized.

In accordance with FIG. 1, in a mask inspection apparatus 100, a mask 121 is mounted on a mask holder 120. The structures to be measured on the mask 121 are illuminated with illumination light generated by a light source 101 via an illumination optical unit 110. Illumination settings can be effected by way of a pupil filter (not illustrated) set in the pupil plane PP, a stop 114 and a polarizer 115. Light coming from the mask 121 is imaged by an imaging optical unit 130 onto a detector unit 140 and detected. The image data recorded by the detector unit 140 are evaluated in an evaluation unit 150 for determining the position of the structures. The position of elements of the mask inspection apparatus 100 can be corrected in all degrees of freedom in each case using manipulators 102.

A description will now be given below, with reference to FIGS. 2-3, of exemplary configurations of a device according to the invention (FIG. 2) and of a method according to the invention (FIG. 3) for characterizing a mask for microlithography (e.g., for use in the projection exposure apparatus shown in FIG. 4).

Figure 2:
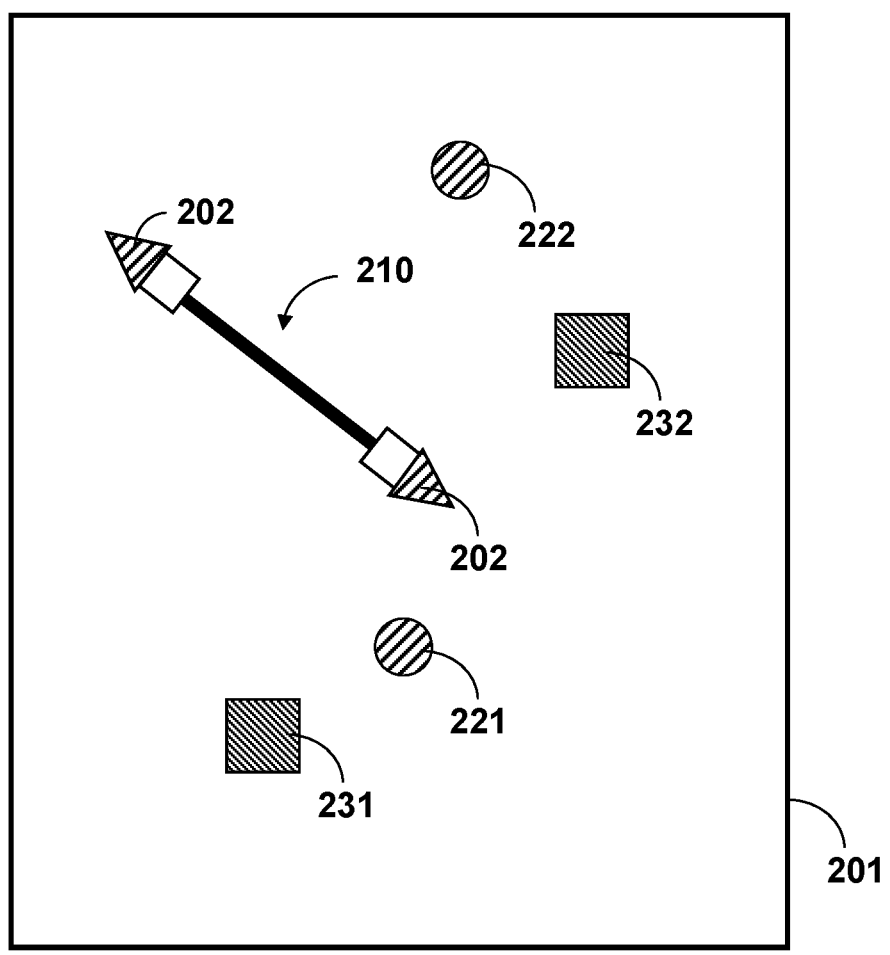
FIG. 2 shows a schematic illustration for elucidating the possible construction of a device according to the invention.

FIG. 2 shows, in a merely schematic and greatly simplified illustration, a vacuum chamber 201 surrounding the device according to the invention for characterizing a mask (e.g., having the construction described above with reference to FIG. 1), wherein an optical component 210 in the form of a mirror is indicated merely by way of example. The positions of the optical components are correctable by use of manipulators 202. In embodiments of the invention, use is made—as described in even greater detail below—of temperature sensors (of which two temperature sensors 221, 222 are indicated merely by way of example in FIG. 2). Heating/cooling units optionally present are indicated by "231" and "232".

What the embodiments described below have in common is that the measurement or characterization process for characterizing the mask is begun even given the presence of a thermal imbalance in the optical system 100 or the vacuum chamber 201 enclosing the latter—for example directly after the loading of a mask or after the change in an illumination setting in the illumination optical unit—without waiting for a relaxation time duration (for approaching thermal equilibrium) to elapse, whereby the available measurement time and thus the throughput achieved with the optical system can be increased as a result.

Figure 3:
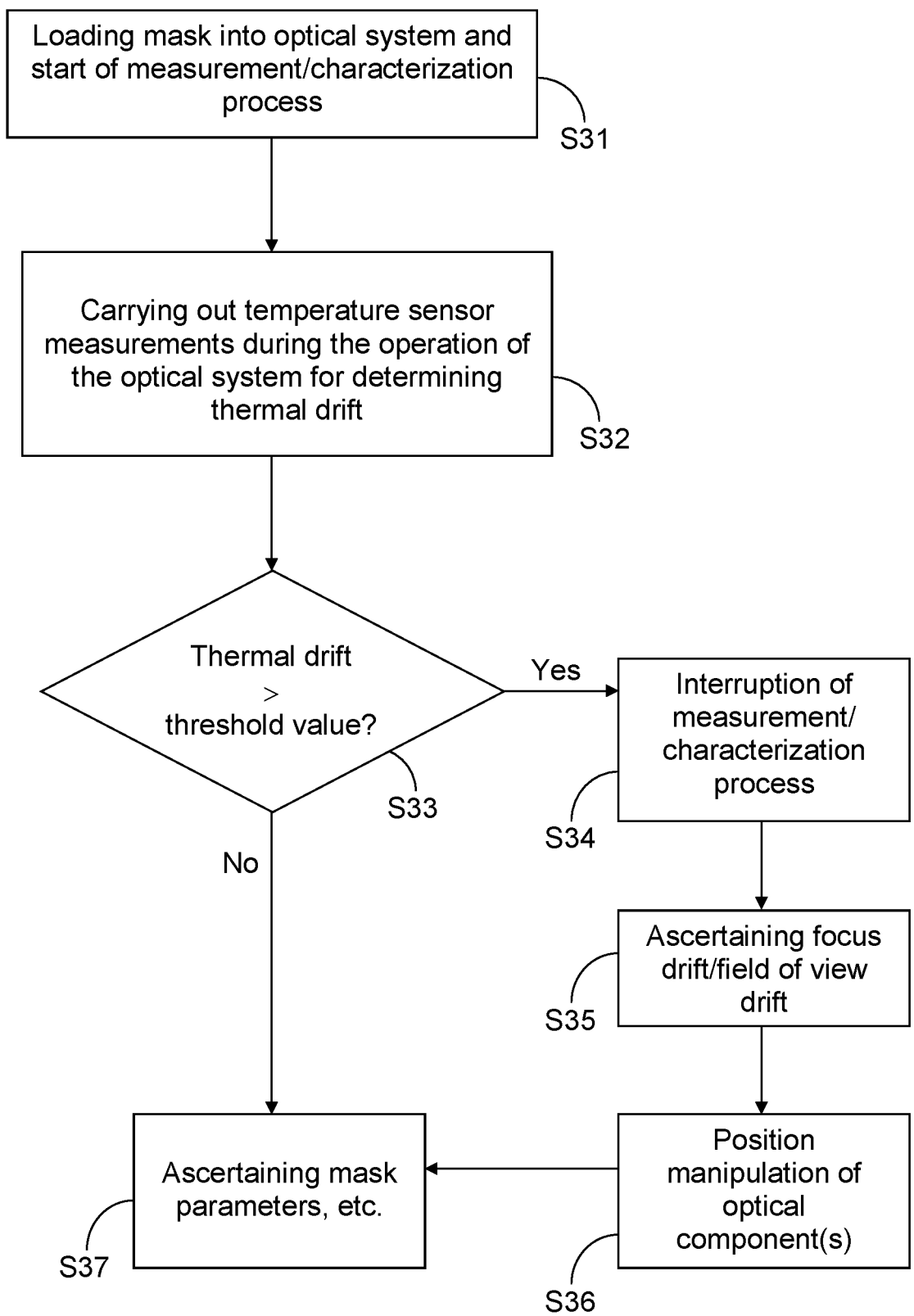
FIG. 3 shows a flow diagram for elucidating the sequence of a method according to the invention in one exemplary embodiment.

In accordance with the flow diagram shown in FIG. 3, such a start of the measurement or characterization process, e.g., directly after a mask has been loaded into the optical system used for the characterization is designated as step "S31".

In order then to take account of the disturbance of thermal equilibrium that is caused by the loading of the mask or the change in the illumination setting and to avoid an erroneous mask characterization, the invention involves carrying out firstly the determination of a temporal variation of a variable that is characteristic of the thermal state of the optical system (e.g., the temperature at one or more positions in the optical system using one or more temperature sensors in accordance with step "S32" in FIG. 3), and secondly—depending on said temporal variation or the thermal drift ascertained therewith—a suitable modification of the measurement or characterization process. The thermal state of the optical system can be measured in various ways, e.g., based on measurement of electrical resistance, or in situ measurement of an expansion or of a distance of a component. Thus, the variable that is characteristic of the thermal state of the optical system can represent one of several properties, e.g., an electrical resistance, or an expansion or of a distance of a component.

Specifically, in the exemplary embodiment in FIG. 3, after step S32 of carrying out temperature sensor measurements, firstly an interrogation is effected in step S33 as to whether the difference of the measured temperature with respect to the reference temperature exceeds a predefined threshold value. For example, the system may include several temperature sensors. The temporal variation can be determined as the difference between the current temperature and a reference temperature (which may, e.g., be the temperature reading for the same sensor during alignment). The relevant time period for this temporal variation can be in the range of, e.g., several minutes or hours. As soon as this is the case in accordance with the interrogation in step S33, in accordance with FIG. 3 the measurement or characterization process is initially interrupted (step S34).

This is then followed firstly by quantitatively ascertaining the focus displacement (in the z-direction or light propagation direction) and field of view displacement (within the x-y-plane perpendicular to the light propagation direction) caused by the thermal drift, with the aid of auxiliary structures (also referred to as marker structures) present in addition to the actual used structures on the mask.

In the case of quantitatively ascertaining the focus displacement, in this case a plurality of images of at least one auxiliary structure at different z-positions or focus positions are measured, and that focus position for which the image contrast is maximal is ascertained. Ascertaining the field of view displacement involves ascertaining the lateral position of the at least one auxiliary structure (i.e., the positioning within the x-y-plane) relative to the center point of the camera or detector unit 140.

Afterward, in step S36 in accordance with FIG. 3 a position manipulation of one or more optical components in the optical system is effected in such a way that the focus and/or field of view displacements determined in the previous (calibration) measurements in accordance with step S35 are completely or at least partly compensated for. For example, the calibration measurements can be performed in step S35, i.e., ascertaining of focus drift and field of view drift. Also, in step S31 the characterization process already includes calibration. Furthermore, the value of the reference temperature can be updated after calibration step S35, so next time when step S33 is performed, the measured temperature is compared with the updated reference temperature, in which the deviation or difference between the measured temperature and the reference temperature corresponds to the thermal drift.

Both with regard to determining the temporal variation of the variable that is characteristic of the thermal state of the optical system or the thermal drift and with regard to modifying the characterization process depending on said temporal variation, the invention is not restricted to the measures effected in the exemplary embodiment in FIG. 3.

In a further (second) exemplary embodiment, with the use of temperature sensors being dispensed with and in the context of a background measurement effected during the actual measurement process in parallel with the measurement or imaging of the mask structures, a structureless region (i.e., a reflective region of the mask on which no used or auxiliary structures are provided) can also be imaged and taken as a basis for a corresponding correction of the actual aerial image (e.g., once again in the form of a position manipulation of one or more optical components).

This calibration by way of the imaging of a structureless region can be realized, e.g., by a stop (comparable to the stop 114 from FIG. 1) being positioned at the intermediate focus of the illumination optical unit, said stop likewise being visible in the aerial images generated in each case, wherein it is possible to measure the lateral position of the stop in comparison with the center point of the detector unit. For example, the system can perform a calibration process to ensure that the center of the stop is aligned with the center point of the detector unit.

In a further (third) embodiment, the temperature values ascertained at different points in time using temperature sensors in the optical system can also be used to correct a drift or a displacement in the so-called "line of sight." For this purpose, the corresponding "line of sight" drift in the x-direction, in the y-direction and in the z-direction (relative to the coordinate system illustrated in FIG. 1) for the relevant temperature changes is calculated on the basis of a fixed sensitivity matrix ascertained beforehand in a separate calibration process, and the position of one or more optical elements (e.g., mirrors within the imaging optical unit of the optical system) is manipulated or adapted in such a way that the calculated "line of sight" drift is completely or at least partly compensated for. In this case, therefore, the procedure is not a direct measurement of the "line of sight" drift, but rather an indirect compensation by way of known temperature effects. For the calibration process used in this case, e.g., the temperature is altered in a targeted manner, the sensors are read in a temporally resolved manner and the drift is measured at time intervals and finally corrected by use of manipulators (this is then the sensitivity matrix). In the actual use, the temperature values are then employed directly to calculate correction values for the manipulators.

The above-described procedure of the "line of sight" drift compensation can be realized in combination with the calibration described above (on the basis of the second exemplary embodiment) using the structureless region of the mask or the imaging of a stop positioned at the intermediate focus.

In a further (fourth) embodiment, reading of temperature sensors in the optical system can also be effected at any desired points in time during the mask characterization in order in this way to determine whether the values respectively obtained (e.g., mask parameters) are sufficiently reliable or whether the relevant values should be discarded or corrected owing to an excessively large thermal drift.

Figure 4:
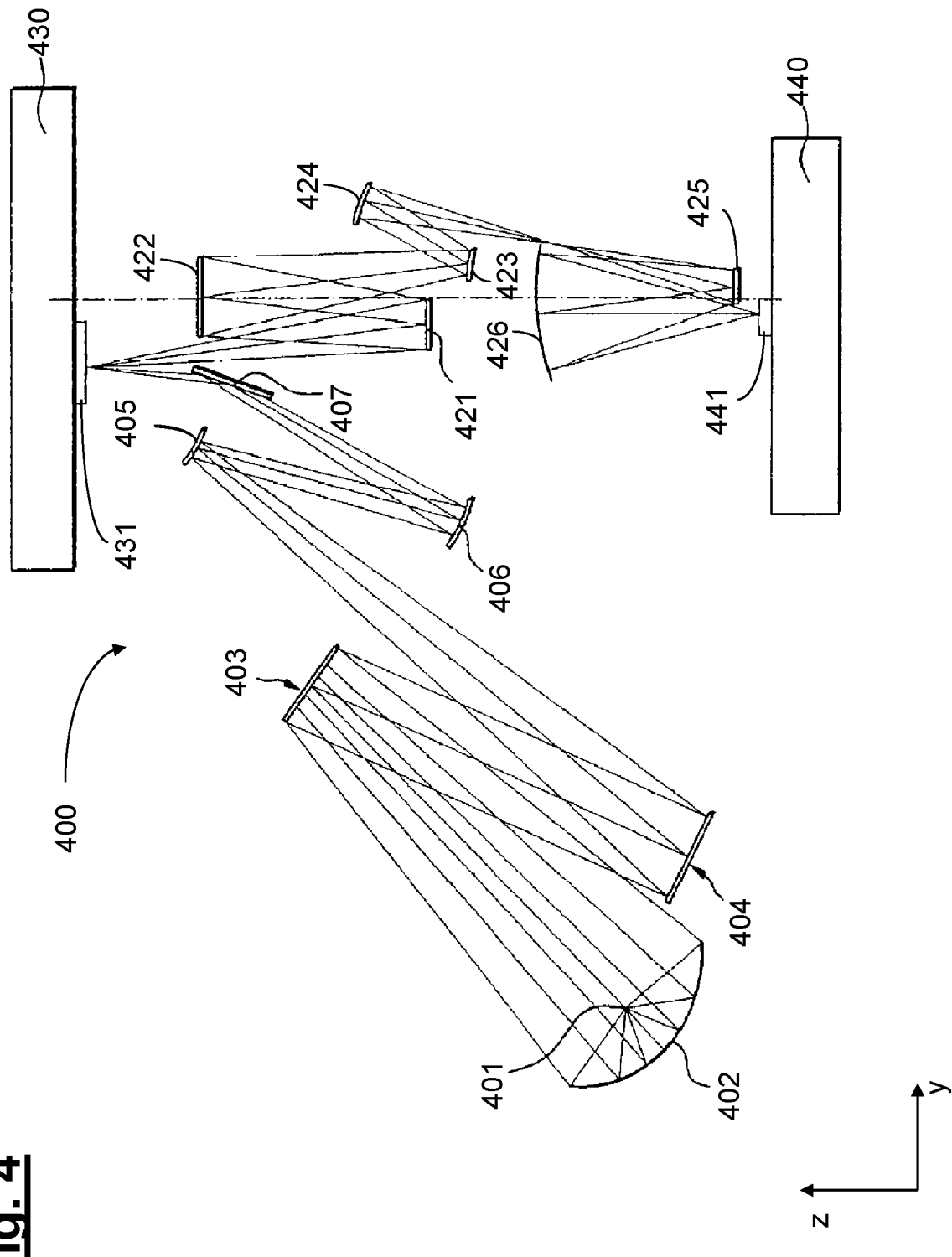
FIG. 4 shows a schematic illustration of a projection lens of a microlithographic projection exposure apparatus designed for operation in the EUV range.

FIG. 4 initially shows a schematic illustration of a projection exposure apparatus 400 designed for operation in the EUV. In accordance with FIG. 4, an illumination unit of the projection exposure apparatus 400 comprises a field facet mirror 403 and a pupil facet mirror 404. The light from a light source unit comprising in the example an EUV light source (plasma light source) 401 and a collector mirror 402 is directed onto the field facet mirror 403. A first telescope mirror 405 and a second telescope mirror 406 are arranged in the light path downstream of the pupil facet mirror 404. A deflection mirror 407 is arranged downstream in the light path, said deflection mirror directing the radiation that is incident thereon onto an object field in the object plane of a projection lens comprising six mirrors 421-426. At the location of the object field, a reflective structure-bearing mask 431 is arranged on a mask stage 430, said mask being imaged with the aid of the projection lens into an image plane in which a substrate 441 coated with a light-sensitive layer (photoresist) is situated on a wafer stage 440.

The invention can be used for characterizing a mask such as is used in the projection exposure apparatus 400 in FIG. 4. In further applications, the invention can also be used for characterizing a mask for use in an apparatus for operation at wavelengths in the DUV range (e.g., at wavelengths of less than 250 nm, in particular less than 200 nm).

In some implementations, the evaluation unit 150 (FIG. 1) can include one or more data processors for processing data, one or more storage devices for storing data, such as one or more databases, and/or one or more computer programs including instructions that when executed by the evaluation unit causes the evaluation unit to carry out the processes. The evaluation unit can include one or more input devices, such as a keyboard, a mouse, a touchpad, and/or a voice command input module, and one or more output devices, such as a display, and/or an audio speaker. The evaluation unit can show graphical user interfaces on the display to assist the user of the mask inspection apparatus 100.

In some implementations, the evaluation unit can include digital electronic circuitry, computer hardware, firmware, software, or any combination of the above. The features related to processing of data can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the evaluation unit is configured to be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

In some implementations, the processes for characterizing a mask for microlithography described above can be implemented using software for execution on one or more mobile computing devices, one or more local computing devices, and/or one or more remote computing devices. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software may be provided on a medium, such as a CD-ROM, DVD-ROM, or Blu-ray disc, readable by a general or special purpose programmable computer or delivered (encoded in a propagated signal) over a network to the computer where it is executed. The functions may be performed on a special purpose computer, or using special-purpose hardware, such as coprocessors. The software may be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

Certain features that are described in this specification in the context of separate embodiments can also be implemented in combination in a single embodiment. Conversely, various features that are described in the context of a single embodiment can also be implemented in multiple embodiments separately or in any suitable subcombination. The separation of various system components in the embodiments described above should not be understood as requiring such separation in all embodiments.

Even though the invention has been described on the basis of specific embodiments, numerous variations and alternative embodiments will be apparent to the person skilled in the art, for example through combination and/or exchange of features of individual embodiments. For example, in step S36, the position(s) of one or more optical components in the optical system is/are manipulated to compensate for thermal drift. In some implementations, instead of a hardware change, e.g., of the positions of optical components, the evaluation software makes a respective correction of the image data considering the determined temporal variation, so that the final image is correctly positioned based on quantifying the impact of the temperature drift. Accordingly, it goes without saying for the person skilled in the art that such variations and alternative embodiments are also encompassed by the present invention, and the scope of the invention is restricted only within the meaning of the appended patent claims and the equivalents thereof.

What is claimed is:

1. A method for characterizing a mask for microlithography in a characterization process carried out using an optical system, wherein the optical system comprises an illumination optical unit and an imaging optical unit and wherein in the characterization process structures of the mask are illuminated by the illumination optical unit, the mask is imaged onto a detector unit by the imaging optical unit and image data recorded by the detector unit are evaluated in an evaluation unit, wherein the method comprises the following steps:
a) determining a temporal variation of at least one variable that is characteristic of the thermal state of the optical system; and
b) modifying the characterization process depending on the temporal variation determined in step a);
wherein step a) of determining a temporal variation is carried out using at least one temperature sensor present in the optical system and by repeatedly measuring the temperature at at least one position in the optical system.

2. The method according to claim 1, in which step a) of determining a temporal variation comprises repeatedly measuring the temperature of an optical component situated in the optical system.

3. The method according to claim 1, in which step b) of modifying the characterization process comprises a temporary interruption of the characterization process.

4. The method according to claim 3, in which said temporary interruption of the characterization process is effected in response to a temporal variation determined in step a) exceeding a predefined threshold value.

5. The method of claim 1, in which step a) of determining a temporal variation comprises imaging a structureless region of the mask.

6. The method of claim 1, in which step a) of determining a temporal variation comprises ascertaining a lateral displacement of the position of a stop in the image data recorded by the detector unit.

7. The method of claim 1, in which step b) of modifying the characterization process comprises manipulating the position of at least one optical component situated in the optical system.

8. The method of claim 1, in which step b) of modifying the characterization process comprises carrying out at least one additional calibration step.

9. The method of claim 1, in which step b) of modifying the characterization process comprises modifying the evaluation of the image data recorded by the detector unit.

10. The method of claim 1, in which the characterization process is begun before a relaxation time duration elapses after a change in the illumination setting set in the illumination optical unit or after the mask has been loaded into the optical system.

11. A device for characterizing a mask for microlithography, the device comprising an illumination optical unit for illuminating structures on the mask, a detector unit, an imaging optical unit for imaging the mask onto the detector unit, and an evaluation unit for evaluating the image data recorded by the detector unit, in which the device is configured to carry out a method according to claim 1.

12. The device of claim 11, in which step a) of determining a temporal variation comprises repeatedly measuring the temperature of an optical component situated in the optical system.

13. The device of claim 11, in which step b) of modifying the characterization process comprises a temporary interruption of the characterization process.

14. The device of claim 13, in which said temporary interruption of the characterization process is effected in response to a temporal variation determined in step a) exceeding a predefined threshold value.

15. The device of claim 11, in which step a) of determining a temporal variation comprises imaging a structureless region of the mask.

16. The device of claim 11, in which step a) of determining a temporal variation comprises ascertaining a lateral displacement of the position of a stop in the image data recorded by the detector unit.

17. The device of claim 11, in which step b) of modifying the characterization process comprises manipulating the position of at least one optical component situated in the optical system.

18. The device of claim 11, in which step b) of modifying the characterization process comprises carrying out at least one additional calibration step.

19. The device of claim 11, in which step b) of modifying the characterization process comprises modifying the evaluation of the image data recorded by the detector unit.

20. The device of claim 11, in which the characterization process is begun before a relaxation time duration elapses after a change in the illumination setting set in the illumination optical unit or after the mask has been loaded into the optical system.

21. The method of claim 1, in which determining a temporal variation of at least one variable that is characteristic of the thermal state of the optical system comprises determining a temporal variation of at least one variable that is characteristic of the thermal state of the optical system based on the image data recorded by the detector unit.

22. The method of claim 8, comprising:
updating the threshold value after carrying out the at least one additional calibration step to generate an updated threshold value based on the measurement of the temperature at at least one position in the optical system,
making a second measurement of the temperature at at least one position in the optical system,
comparing the second measurement of the temperature at at least one position in the optical system with the updated threshold value, and
effecting a second temporary interruption of the characterization process in response to a determination that the second measurement of the temporal variation of the at least one variable exceeds the updated threshold value.

23. The method of claim 22, comprising after effecting the second temporary interruption of the characterization process, performing a calibration measurement to determine a field of view displacement, and modifying a position or positions of one or more optical components in the optical system to compensate for the field of view displacement.

24. The method of claim 1, comprising upon determining the temporal variation of at least one variable that is characteristic of the thermal state of the optical system, determining a field of view displacement caused by thermal drift with aid of at least one structure on the mask.

25. The method of claim 24, in which determining the field of view displacement comprises determining a lateral position of the at least one structure on the mask relative to a center point of the detector.

26. The method of claim 6, comprising performing a calibration process to ensure that a center of the stop is aligned with a center point of the detector unit.

* * * * *